(12) United States Patent
Beam, III et al.

(10) Patent No.: US 12,166,118 B2
(45) Date of Patent: Dec. 10, 2024

(54) HIGH ELECTRON MOBILITY TRANSISTORS (HEMTS) INCLUDING A YTTRIUM (Y) AND ALUMINUM NITRIDE (AlN) (YAlN) ALLOY LAYER

(71) Applicant: Qorvo US, Inc., Greensboro, NC (US)

(72) Inventors: Edward Beam, III, Plano, TX (US); Jinqiao Xie, Allen, TX (US); Antonio Lucero, Garland, TX (US)

(73) Assignee: Qorvo US, Inc., Greensboro, NC (US)

( * ) Notice: Subject to any disclaimer, the term of this patent is extended or adjusted under 35 U.S.C. 154(b) by 434 days.

(21) Appl. No.: 17/570,600

(22) Filed: Jan. 7, 2022

(65) Prior Publication Data
US 2023/0223467 A1 Jul. 13, 2023

(51) Int. Cl.
*H01L 29/778* (2006.01)
*H01L 29/20* (2006.01)
*H01L 29/78* (2006.01)

(52) U.S. Cl.
CPC ...... *H01L 29/7786* (2013.01); *H01L 29/2003* (2013.01); *H01L 29/7842* (2013.01)

(58) Field of Classification Search
CPC ............. H01L 29/7786; H01L 29/2003; H01L 29/7842; H01L 29/42316; H01L 29/201; H01L 29/205; H01L 29/7783; H01L 29/66462
See application file for complete search history.

(56) References Cited

U.S. PATENT DOCUMENTS

| | | | |
|---|---|---|---|
| 10,109,728 B2* | 10/2018 | Coffie | H01L 29/66462 |
| 10,734,512 B2* | 8/2020 | Beam, III | H01L 29/201 |
| 2023/0378276 A1* | 11/2023 | Casamento | H01L 29/7786 |

OTHER PUBLICATIONS

Zukauskaite, A. et al., "YxAl1—xN thin films," Journal of Physics D: Applied Physics, vol. 45, No. 42, Sep. 2012, IOP Publishing, 7 pages.

* cited by examiner

*Primary Examiner* — Allison Bernstein
(74) *Attorney, Agent, or Firm* — Withrow & Terranova, P.L.L.C.

(57) ABSTRACT

A layer of yttrium (Y) and aluminum nitride (AlN) is employed as a back-barrier to improve confinement of electrons within a channel layer of a high electron mobility transistor (HEMT). As HEMT dimensions are reduced and a channel length decreases, current control provided by a gate also decreases, and it becomes more difficult to "pinch-off" current flow through the channel. A back-barrier layer on a back side of the channel layer improves confinement of electrons to improve pinch-off but does not cause a second 2DEG to be formed below the back-barrier layer. The YAlN layer can be lattice-matched to the channel layer to avoid lattice strain, and a thin layer of YAlN provides less thermal resistance than HEMTs made with thicker back-barrier materials. Due to its chemical nature, a YAlN layer can be used as an etch stop layer.

11 Claims, 5 Drawing Sheets

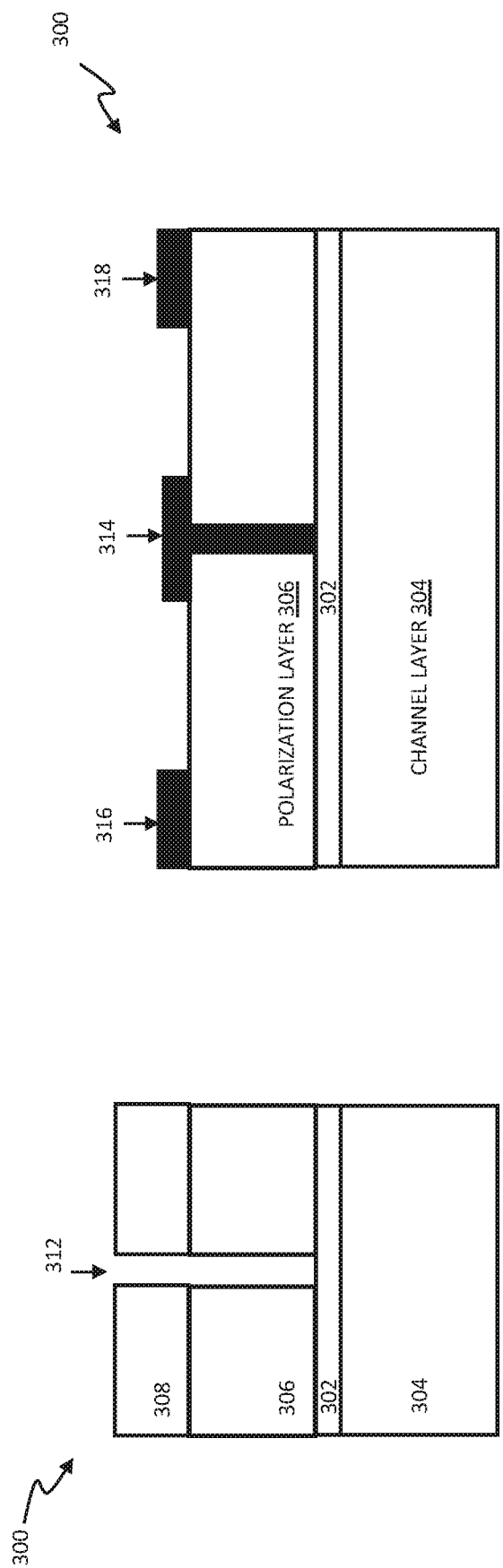

HIGH ELECTRON MOBILITY TRANSISTORS (HEMTS) INCLUDING A YTTRIUM (Y) AND ALUMINUM NITRIDE (AlN) (YAlN) ALLOY LAYER

FIELD OF THE DISCLOSURE

The technology of the disclosure relates generally to high electron mobility transistors (HEMTs) and particularly to Gallium Nitride (GaN) HEMTs.

BACKGROUND

High-electron-mobility-transistors (HEMTs) made of Gallium Nitride (GaN), alloys of aluminum nitride (AlN), and other semiconductors are preferred for many applications over silicon metal-oxide-semiconductor (MOS) field-effect transistors (FETs) (MOSFETs). Transistors made with wider bandgap semiconductor materials, such as GaN and AlGaN, can operate at higher voltages and higher temperatures, making them preferable for use in high power applications. In addition, due to the high density and high mobility of electrons in a two-dimensional electron gas (2DEG) conduction channel, HEMTs can switch at higher frequencies than MOSFETs with a same device dimension.

As electronic devices trend smaller in size, there are challenges to reducing the sizes of HEMT devices. For example, as device sizes are reduced, the channel length of a HEMT is reduced, which makes confinement and control of electrons in the 2DEG layer more difficult. In particular, a shorter channel length reduces the ability to pinch-off conduction in a channel, such that it can be difficult to fully turn off current flow in a HEMT. There are also challenges in manufacturing HEMTs of reduced size. What is needed are materials and structures that can be used to overcome some of the challenges in making HEMTs with smaller dimensions.

SUMMARY

Aspects disclosed in the detailed description include high-electron-mobility transistors (HEMTs), including a yttrium (Y) and aluminum nitride (AlN) (YAlN) alloy layer. Methods of making HEMTs, including a layer of a YAlN alloy, are also disclosed. A layer of yttrium (Y) and aluminum nitride (AlN) (e.g., YAlN) is employed as a back-barrier to improve confinement of electrons within a channel layer (e.g., a gallium nitride (GaN) channel layer) of a HEMT. At a heterojunction of the channel layer and a barrier layer (e.g., aluminum (Al) GaN) (AlGaN) in a HEMT, a two-dimensional electron gas (2DEG) layer provides a conduction channel. A bias voltage applied to a gate adjacent to the 2DEG controls the flow of majority carriers (e.g., electrons) in the 2DEG but, as HEMT dimensions are reduced and a channel length decreases, current control provided by the gate also decreases. As a result, it becomes more difficult to shut off (e.g., "pinch off") current flow through the channel. Providing a back-barrier layer on a back side of the channel layer improves confinement of electrons in the channel and increases gate control to improve pinch-off (e.g., minimizing current flow in the off state). The lattice-matched YAlN alloy layer has a wider bandgap than the GaN channel that helps to confine electrons to the channel layer but does not exhibit polarization and, therefore, does not cause a second 2DEG to be formed at the lower interface of YalN/GaN. Another benefit of the YalN alloy layer as a back-barrier layer is that it can be lattice-matched to the channel and buffer layer to avoid lattice strain that causes piezoelectric effects. Also, because the back-barrier function can be provided by a thin layer of YAlN, a HEMT employing the YAlN layer as a back-barrier layer has smaller thermal resistance than HEMTs made with thicker back-barrier materials. In another exemplary aspect, in addition to the properties described above, due to its chemical nature, a YAlN alloy layer can also be used as an etch stop layer. As an example, a YAlN layer can be used for locating a metal gate in an AlGaN/GaN HEMT or as an etch stop layer in optoelectronic devices, including GaN.

In one exemplary aspect, a HEMT is disclosed. The HEMT includes a first layer comprising a first semiconductor material comprising a first bandgap, a second layer comprising a second semiconductor material comprising a second bandgap larger than the first bandgap, the second layer on a first side of the first layer; and a back-barrier layer comprising an alloy comprising yttrium and aluminum nitride on a second side of the first layer.

In another exemplary aspect, a HEMT is disclosed. The HEMT includes a channel layer comprising a first semiconductor material comprising a first bandgap, an etch stop layer comprising an alloy comprising yttrium and aluminum nitride on the channel layer, the alloy comprising a second bandgap larger than the first bandgap, and a gate disposed on the etch stop layer.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

FIGS. 3A-3D are illustrations of cross-sectional side views of stages of fabrication of a second HEMT, including an etch stop layer of an alloy of Y and AlN on which for forming a gate on a channel layer.

DETAILED DESCRIPTION

Figure 1:
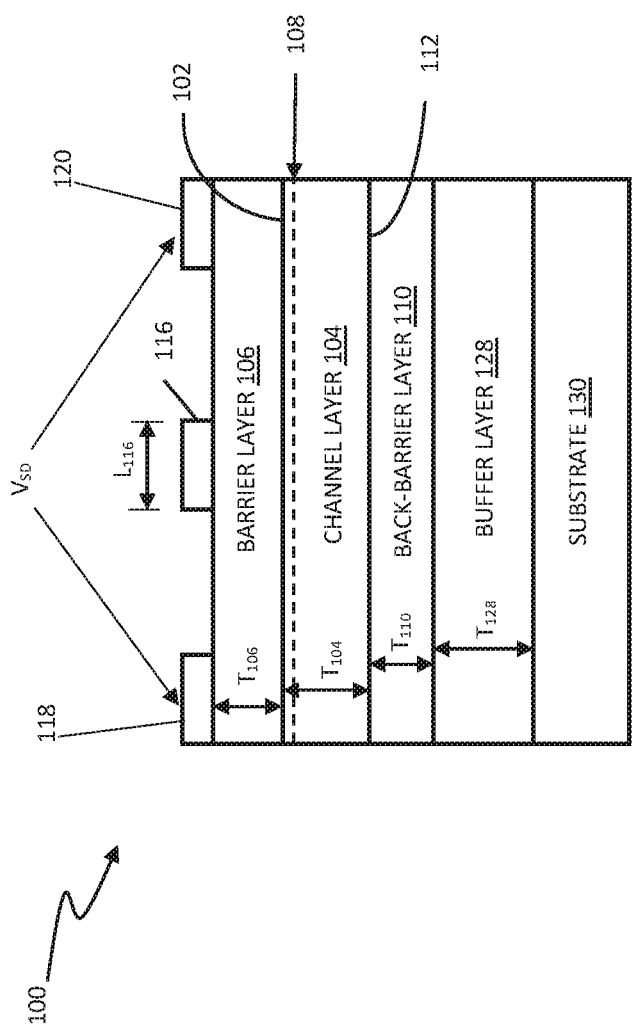
FIG. 1 is an illustration of a cross-sectional side view of a high-electron-mobility transistor (HEMT) in which a heterojunction of a channel layer and a barrier layer creates a two-dimensional electron gas (2DEG) conduction channel and an alloy of yttrium (Y) and aluminum nitride (AlN) providing a back-barrier layer on a bottom side of the channel layer to confine electrons in the channel layer.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc., may be used herein to describe various elements, these elements should not be limited by these terms. These terms are only used to distinguish one element from another. For example, a first element could be termed a second element, and, similarly, a second element could be termed a first element without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

Relative terms such as "over" or "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include high-electron-mobility transistors (HEMTs), including a yttrium (Y) and aluminum nitride (AlN) (YAlN) alloy layer. Methods of making HEMTs, including a layer of a YAlN alloy, are also disclosed. A layer of yttrium (Y) and aluminum nitride (AlN) (e.g., YAlN) is employed as a back-barrier to improve confinement of electrons within a channel layer (e.g., a gallium nitride (GaN) channel layer) of a HEMT. At a heterojunction of the channel layer and a barrier layer (e.g., aluminum (Al) GaN) (AlGaN) in a HEMT, a two-dimensional electron gas (2DEG) layer provides a conduction channel. A bias voltage applied to a gate adjacent to the 2DEG controls the flow of majority carriers (e.g., electrons) in the 2DEG but, as HEMT dimensions are reduced and a channel length decreases, current control provided by the gate also decreases. As a result, it becomes more difficult to shut off (e.g., "pinch off") current flow through the channel. Providing a back-barrier layer on a back side of the channel layer improves confinement of electrons in the channel and increases gate control to improve pinch-off (e.g., minimizing current flow in the off state). The lattice-matched YAlN alloy layer has a wider bandgap than the GaN channel that helps to confine electrons to the channel layer but does not exhibit polarization and, therefore, does not cause a second 2DEG to be formed at the lower interface of YAlN/GaN. Another benefit of the YAlN alloy layer as a back-barrier layer is that it can be lattice-matched to the channel layer and buffer layer to avoid lattice strain that causes piezoelectric effects. Also, because the back-barrier function can be provided by a thin layer of YAlN, a HEMT employing the YAlN layer as a back-barrier layer has smaller thermal resistance than HEMTs made with thicker back-barrier materials. In another exemplary aspect, in addition to the properties described above, due to its chemical nature, a YAlN alloy layer can also be used as an etch stop layer. As an example, a YAlN layer can be used for locating a metal gate in an AlGaN/GaN HEMT or as an etch stop layer in optoelectronic devices, including GaN.

In recent years, epitaxial layers of scandium (Sc) gallium (Ga) aluminum nitride (AlN) (ScGaAlN) have been incorporated into gallium nitride (GaN) based HEMTs. Sc can be substituted for Al and/or Ga in alloys of GaN, AlN, AlGaN, indium (In) aluminum nitride (InAlN), etc. $Sc_xAl_{1-x}N$ (where X is approximately 18 percent (%)) can be grown lattice-matched to GaN and provides a high polarization charge, which creates a 2-dimensional electron gas (2DEG) with a high charge density at a ScAlN/GaN interface. Since yttrium (Y) and Sc are both Group III-B atoms in the Periodic Table, it was expected that Y may also be substituted for Ga, Al, or In in Group III-N alloys, but the range of compositions of alloys of Y compatible with a Wurtzite lattice is unknown.

Alloys containing Y were grown in a molecular beam epitaxy (MBE) reactor with the addition of a high-temperature effusion cell. A high purity (e.g., 99.99%) Y rod in a tungsten crucible and Y flux were used at effusion cell temperatures exceeding 1300 degrees Celsius (C) (1300 C) (e.g., 1465 C) for growth of epitaxial alloys of YAlN and YGaN. The "a" lattice parameters of YAlN vary with Y content and can be "matched" to the lattice parameters of materials such as GaN and AlGaN. In an experiment in which YAlN is grown by epitaxy on GaN, as the Y concentration is increased to a point at which the a lattice parameters of the YAlN match those of GaN, the measured sheet resistance of the YAlN increased dramatically, which is an unexpected result. A higher sheet resistance indicates a reduced charge in the 2DEG at the junction of the GaN and the YAlN, which further indicates a lack of polarization in the YAlN in contrast to the high polarization found in similar structures of ScAlN. Additional measurements confirmed the low polarization of YAlN. Applications of an alloy of Y and AlN are described below with reference to FIGS. 1-3D.

FIG. 1 is an illustration of a cross-sectional side view of a HEMT 100 in which a heterojunction 102 of a channel layer 104 and a barrier layer 106 creates a two-dimensional electron gas (2DEG) conduction channel 108 and a back-barrier layer 110 comprising a YAlN alloy on a back side 112 of the channel layer 104 confines electrons to the channel layer 104. The barrier layer 106 is disposed on a top side 114 of the channel layer 104, and the back-barrier layer 110 is on the back side 112 in the orientation shown in FIG. 1. Other features of the HEMT 100 can also be described in terms of the orientation shown in FIG. 1. Electrons accumulate in the 2DEG conduction channel 108 due to the bandgap of the barrier layer 106 being wider than the bandgap of the channel layer 104 and also due to the high polarization of the barrier layer 106. The bandgap of the back-barrier layer 110 is also wider than the bandgap of the channel layer 104, which prevents electrons from escaping out the back side 112 of the channel layer 104; however, the back-barrier layer 110 does not exhibit polarization. Therefore, the back-barrier layer 110 does not cause a second 2DEG to be formed below the back-barrier layer 110 in buffer layer 128. Employing a back-barrier material that does not create a second 2DEG limits the HEMT 100 to a single channel, which allows the device to be better controlled.

As HEMT dimensions are scaled down, a length $L_{116}$ of a gate 116 becomes shorter, causing the gate 116 to have a smaller control region of electrons in the 2DEG conduction channel 108. In normal operation, a first bias voltage on a gate 116 can significantly deplete electrons in the 2DEG conduction channel 108 adjacent to the gate 116 to turn off current flow in the HEMT 100. In contrast, with a second bias voltage, high mobility electrons become concentrated below the gate 116 to enable current flow in the 2DEG conduction channel 108 based on a source-drain voltage $V_{SD}$ between a source terminal 118 and a drain terminal 120. A shorter gate 116 exerts an electric field over a smaller length $L_{116}$ of the 2DEG conduction channel 108 and consequently provides less control over the current flow, making it difficult to pinch off (e.g., shut off) current in the HEMT 100. The back-barrier layer 110 helps confine current flow to the channel layer 104, which includes cutting off current paths outside the channel layer 104. In this manner, current can be better controlled by the gate 116 to improve pinch-off in a scaled-down HEMT 100.

Wide bandgap materials are used as back-barrier layers because their conduction band energy levels are higher than energy levels in the 2DEG conduction channel 108, which makes it difficult for electrons in the channel layer 104 to escape. However, some wide bandgap materials used in a back-barrier layer have undesirable effects in a HEMT. For example, a wide bandgap material with high polarization can cause a second 2DEG conduction channel 108 to form below the back-barrier layer 110, providing a path for leakage current. In addition, a wide bandgap material in which the lattice structure does not match the lattice of the channel layer 104 can produce strain at the interface, producing piezoelectric polarization that may also promote the $2^{nd}$ channel. Furthermore, a thick layer of some wide bandgap materials may be needed to provide the back-barrier benefit, but such a thick layer reduces thermal conductivity and heat dissipation, which can be especially problematic in high-frequency power circuits in which HEMTs are often employed. However, the back-barrier layer 110 of YAlN avoids or reduces such problems.

The channel layer 104 is formed of a first semiconductor material having a first bandgap. In some examples, the first semiconductor material is gallium nitride (GaN). The barrier layer 106 is a second semiconductor material with a bandgap that is larger (e.g., wider) than the bandgap of the channel layer 104. In some of these examples, the second semiconductor material of the barrier layer 106 is an alloy including aluminum, such as ScAlN, AlGaN, or another wide bandgap alloy including AlN. The back-barrier layer 110 is an alloy of yttrium (Y) and aluminum nitride AlN, such as YAlN or YGaAlN, with a band gate that is also wider than the bandgap of the channel layer 104. In some examples, the channel layer 104 has a thickness $T_{104}$ of 40 nanometers (nm), and the barrier layer 106 has a thickness $T_{106}$ of 12 nm. In some examples, the channel layer 104 has a thickness $T_{104}$ in a range of 35 nm to 45 nm, and the barrier layer 106 has a thickness $T_{106}$ in a range from 9 nm to 15 nm. In some examples, the channel layer 104 has the thickness $T_{104}$ in a range of 5 nm to 50 nm, and the barrier layer 106 has a thickness $T_{104}$ in a range from 3 nm to 18 nm.

In exemplary aspects disclosed herein, a thin layer of the alloy may provide a back-barrier to confine electrons in the channel layer 104. A thin back-barrier layer 110 does not reduce thermal conductivity and heat dissipation to the same extent as thicker materials used for a back-barrier layer. As the back-barrier layer 110 increases in thickness, the barrier characteristic may be improved, but thermal conductivity is decreased. Thus, the thickness of the alloy is a compromise between barrier quality and thermal resistance. In some examples, the back-barrier layer 110 may have a thickness $T_{110}$ of 10 nm, and, in some examples, the back-barrier layer 110 has a thickness $T_{110}$ in a range of 8 nm to 12 nm. In some examples, the back-barrier layer 110 may have a thickness $T_{110}$ in a range of 5 nm to 16 nm.

In some examples, the alloy is YAlN but may alternatively be YAlGaN. The concentration of Y in the alloy may be adjusted so that a lattice constant (e.g., lattice constant "a") of a Wurtzite type crystal, not shown) of the alloy "matches" a corresponding lattice constant of GaN in the channel layer 104. Matching a lattice of the back-barrier layer 110 to the channel layer 104 minimizes the potential for piezoelectric effects. Materials having a "matched" lattice parameter, as disclosed herein, refers to having a lattice constant of a first material that is within three percent (3%) of a corresponding lattice constant of a second material. In addition, as noted above, the alloy of YAlN does not show an indication of high polarization and, therefore, does not create a second 2DEG below the back-barrier 110 that could not be controlled by the gate 116. In this regard, a leakage current path is avoided.

With continued reference to FIG. 1, operation of the HEMT 100 includes biasing the gate 116 to allow current flow in the 2DEG conduction channel 108 and also applying a voltage between the source terminal 118 (grounded) and a drain terminal 120. The gate 116 is disposed on the barrier layer 106 between the source terminal 118 and the drain terminal 120. The back-barrier layer 110 of the HEMT 100 is on a buffer layer 128. The buffer layer 128 may be a same or similar material as the channel layer 104, to which the back-barrier layer 110 is lattice-matched. Thus, the back-barrier layer 110 may also be lattice-matched to the buffer layer 128. The buffer layer 128 is formed on a substrate 130, such as silicon carbide, silicon, or sapphire. For example, the buffer layer 128 may be an alloy of GaN between the substrate 130 and the back-barrier layer 110. The buffer layer 128 has a thickness $T_{128}$ that is greater than the thickness $T_{104}$ of the channel layer 104. Formation of the buffer layer 128, the back-barrier layer 110, the channel layer 104, and the barrier layer 106 includes growing such layers by epitaxy. Epitaxial growth may be performed by molecular beam epitaxy (MBE), chemical beam epitaxy (CBE), and/or metal-organic chemical vapor deposition (MOCVD), for example. The HEMT 100 may include other layers or features not explicitly shown here.

In another exemplary aspect, based on the above-described properties of a YAlN alloy, another application of a YAlN layer in the manufacture of wide bandwidth semiconductor devices is disclosed. FIG. 2A is an illustration of a cross-sectional side view, in a stage of manufacture, of a HEMT device structure 200, including an etch stop layer 202 comprising an alloy 204 of Y and AlN on a barrier layer 206. The YAlN alloy 204 is not limited to use in a HEMT device structure, as illustrated in FIGS. 2A-2D, and also could be employed, for example, in optoelectronic devices such as LEDs and laser diodes based on GaN, AlGaN, and related materials.

The HEMT device structure 200 is described with reference to the orientation shown in FIG. 2A, which includes the barrier layer 206 on a channel layer 208, the etch stop layer 202 on the barrier layer 206, and a polarization layer 210 on the etch stop layer 202. The channel layer 208 is a first semiconductor material, such as GaN, grown by epitaxy on a buffer layer (not shown). The barrier layer 206 in this example is a second semiconductor material, which may be an alloy of two (2) or more elements grown on the channel layer 208. In some examples, the second semiconductor material is an alloy of Al, Ga, and N (e.g., AlGaN). The etch stop layer 202 can be adjusted to be lattice-matched to the second semiconductor material by adjusting concentrations of the Y in the alloy 204. As noted above, "lattice-matched" indicates that at least one lattice parameter of the etch stop layer 202 is within 3% of a corresponding lattice parameter of the barrier layer 206. In some examples, the polarization layer 210 also comprises the second semiconductor material 214, such as AlGaN grown on the etch stop layer 202. The second semiconductor material 214 may have the same or different concentrations of Al, Ga, and N as the barrier layer 206 and may also be lattice-matched to the etch stop layer 202. The channel layer 208, the barrier layer 206, the etch stop layer 202, and the polarization layer 210 may be grown in sequential epitaxial processes.

In some examples, the barrier layer 206 may have a thickness $T_{206}$ of 2 nm or may be in a range between 1 nm and 3 nm. In such examples, the etch stop layer 202 may have a thickness $T_{202}$ of 1 nm or may be in a range between 0.5 nm and 5 nm. The polarization layer 210 in such examples has a thickness $T_{210}$ of twelve (12) nm or may be in a range between 2 and 20 nm.

Figure 2B:
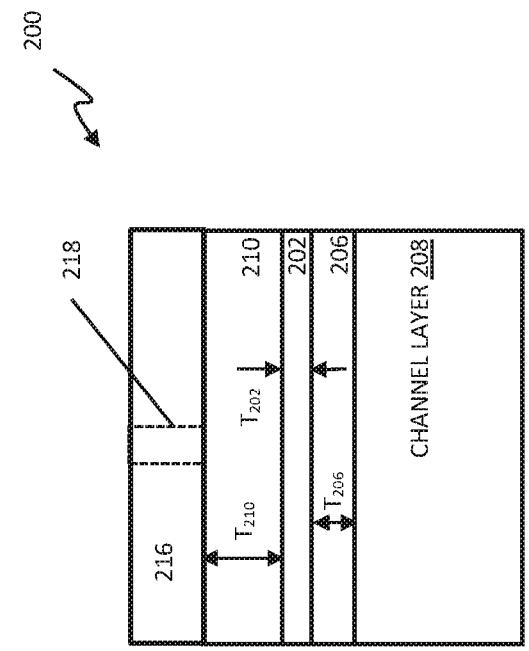
FIG. 2A-2D are illustrations of cross-sectional side views, in stages of fabrication, of a first HEMT including an etch stop layer of an alloy of Y and AlN for positioning a metal gate on a barrier layer.
Figure 2A:
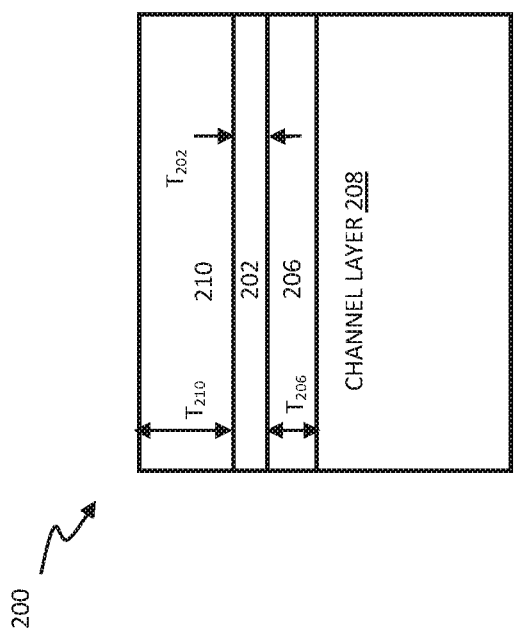

FIG. 2B is an illustration of a cross-sectional side view of the HEMT device structure 200 in a second stage of manufacture in which a hard mask layer 216 is formed (e.g., by deposition) on the polarization layer 210 to define a gate region 218. In this example, the hard mask layer 216 is an oxide of silicon (SiOx). FIG. 2C is an illustration of the cross-sectional side view of the HEMT device structure 200 in a third stage of manufacture in which the hard mask layer 216 has been patterned (e.g., by photolithography and etching) to form an opening 220 through the hard mask layer 216 corresponding to the gate region 218. FIG. 2C is a cross-sectional side view showing that the polarization layer 210 is etched, through the opening 220, through to the etch stop layer 202 to form the gate region 218. The process used to etch the polarization layer 210 does not penetrate the YAlN etch stop layer 202. Thus, a metal gate 222, shown in FIG. 2D, can be reliably located at a desired distance from the channel layer 208.

Figure 2D:
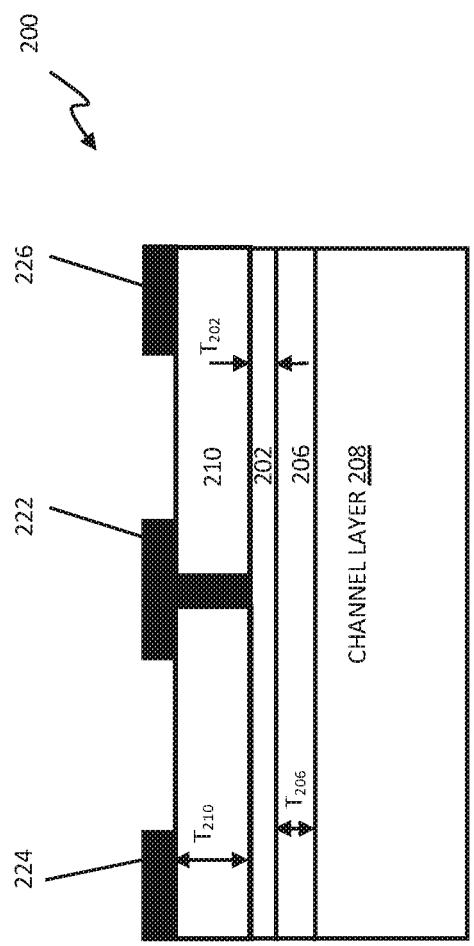
Figure 2C:
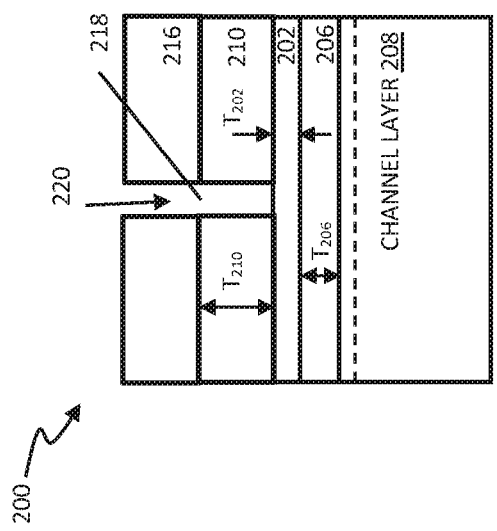

FIG. 2D is an illustration of a cross-sectional side view of the HEMT device structure 200 in a fourth stage of manufacture in which the metal gate 222 is formed in the opening 220 (see FIG. 2C) in the gate region 218. The metal gate 222 is formed on the etch stop layer 202. The chemical nature of the etch stop layer 202 is such that a thin layer provides both the etch stop capability in a process that etches the second semiconductor material 214 (e.g., AlGaN), while also providing a good Schottky contact for the metal gate 222, and also allowing the metal gate 222 to be at a desired distance from the channel layer 208. Employing the etch stop layer 202 avoids a manufacturing challenge in which, in the absence of the etch stop layer 202, a timed etch is used to determine the thickness $T_{206}$ of the barrier layer 206 between the metal gate 222 and the channel layer 208. Forming the metal gate 222 may include a metallization step of depositing a metal layer (not shown), patterning the metal layer on top of the polarization layer 210, and etching the metal layer to form the metal gate 222 based on the patterning. A source terminal 224 and a drain terminal 226 may be formed on the polarization layer 210 during the formation of an enhancement-mode (E-mode) HEMT device structure 200.

Figure 3B:
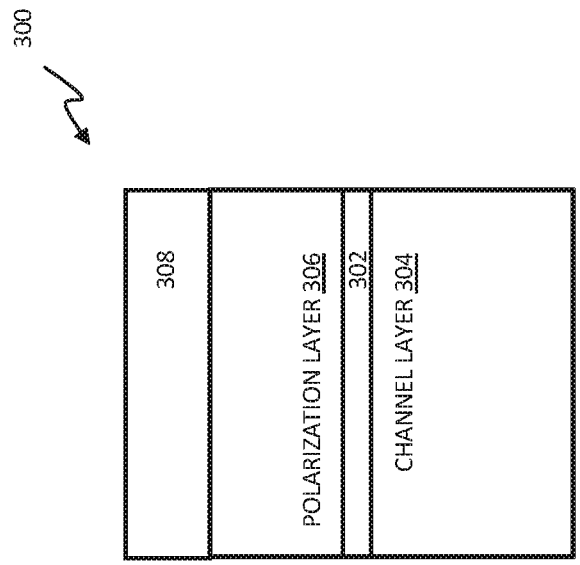
Figure 3A:
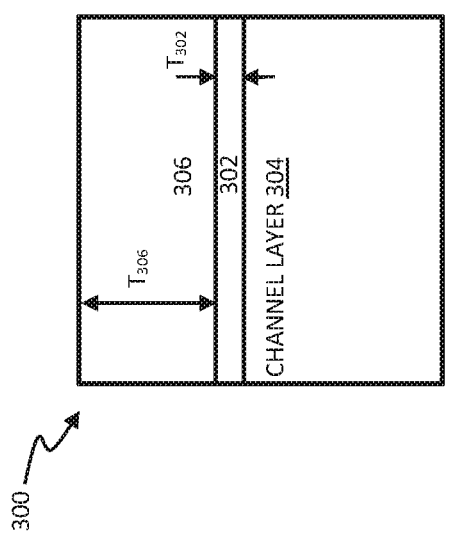

FIGS. 3A-3D are illustrations of cross-sectional side views of another HEMT device structure 300 in various stages of manufacture. The HEMT device structure 300 in FIG. 3A corresponds to the HEMT device structure 200 in FIGS. 2A-2D with the exclusion of the barrier layer 206. In this regard, the HEMT device structure 300 included in a HEMT device operates in a normally-off operation (e.g., depletion mode). As shown in FIG. 3A, the HEMT device structure 300 includes an etch stop layer 302 grown on a channel layer 304 (e.g., GaN) without an intervening barrier layer. The channel layer 304, the etch stop layer 302 (e.g., YAlN or YGaAlN), and the polarization layer 306 (e.g., AlGaN) are grown in a sequence of epitaxial processes. As in the HEMT device structure 300, the etch stop layer 302 can provide the etch stop function with a thickness $T_{302}$ of 1 nm or in a range between 0.5 nm and 5 nm. The polarization layer 306 in this example has a thickness $T_{306}$ of 12 nm and may be in a range between 5 nm and 25 nm. An etch process can remove the polarization layer 306 in a patterned region without removing the etch stop layer 302.

FIG. 3B shows a hard mask layer 308 (e.g., SiOx) formed on the polarization layer 306. FIG. 3C shows the HEMT device structure 300 after the hard mask layer 308 is patterned for a gate region 310 to form an opening 312 in the gate region 310. The polarization layer 306 is etched through the opening 312 to the etch stop layer 302. FIG. 3D is an illustration of a cross-sectional side view of the HEMT device structure 300 in a fourth stage of manufacture in which a metal gate 314 is formed in the gate region 310. The metal gate 314 is formed on the etch stop layer 302. Here, the HEMT device structure 300 includes a source terminal 316 and a drain terminal 318.

Those skilled in the art will recognize improvements and modifications to the embodiments of the present disclosure. All such improvements and modifications are considered within the scope of the concepts disclosed herein and the claims that follow.

What is claimed is:

1. A high electron mobility transistor (HEMT) comprising:
   a channel layer comprising a first semiconductor material;
   an etch stop layer comprising an alloy comprising yttrium and aluminum nitride on the channel layer;
   a metal gate disposed on the etch stop layer, and
   a polarization layer on the etch stop layer, the polarization layer comprising a second semiconductor material;
   wherein the etch stop layer is directly on the channel layer, and a lattice constant of a lattice of the etch stop layer is within three percent (3%) of a lattice constant of a lattice of the channel layer; and wherein:

a first portion of the metal gate extends through the second semiconductor material to the etch stop layer; and a second portion of the gate is disposed on a second side of the polarization layer.

2. The HEMT of claim 1, wherein:

the etch stop layer comprises a thickness from 0.5 nanometers (nm) to 5 nm; and the polarization layer comprises a thickness from 5 nm to 25 nm.

3. The HEMT of claim 1, wherein:

the etch stop layer comprises a thickness of 1.0 nanometer (nm); and the polarization layer comprises a thickness of 12 nm.

4. The HEMT of claim 1, further comprising a barrier layer disposed between the channel layer and the etch stop layer.

5. The HEMT of claim 4, wherein the etch stop layer is directly on the barrier layer and a lattice constant of a lattice of the etch stop layer is within three percent (3%) of a lattice constant of a lattice of the barrier layer.

6. The HEMT of claim 5, further comprising a polarization layer comprising a second semiconductor material, wherein:

the barrier layer comprises the second semiconductor material.

7. The HEMT of claim 6, wherein:

a first portion of the metal gate extends through the second semiconductor material to the etch stop layer; and a second portion of the gate is disposed on a second side of the polarization layer.

8. The HEMT of claim 6, further comprising:

a source terminal on the polarization layer on a first side of the metal gate; and a drain terminal on the polarization layer on a second side of the metal gate, the second side opposite the first side.

9. The HEMT of claim 1, wherein:

the etch stop layer comprises a thickness from 0.5 nanometers (nm) to 5 nm;

the barrier layer comprises a thickness from 1.0 nm to 5.0 nm; and the polarization layer comprises a thickness from 5 nm to 25 nm.

10. The HEMT of claim 1, wherein:

the etch stop layer comprises a thickness of 1.0 nanometer (nm);

the barrier layer comprises a thickness of 2.0 nm; and the polarization layer comprises a thickness of 12 nm.

11. The HEMT of claim 1, further comprising:

a source terminal on the polarization layer on a first side of the metal gate; and a drain terminal on the polarization layer on a second side of the metal gate, the second side opposite the first side.

* * * * *